US009246091B1

(12) United States Patent
Wang et al.

(10) Patent No.: US 9,246,091 B1
(45) Date of Patent: Jan. 26, 2016

(54) RERAM CELLS WITH DIFFUSION-RESISTANT METAL SILICON OXIDE LAYERS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Federico Nardi, Palo Alto, CA (US)

(73) Assignees: Intermolecular, Inc., San Jose, CA (US); Kabushiki Kaisha Toshiba, Tokyo (JP); SanDisk 3D LLC, Milpitas, CA (US)

(*) Notice: Subject to any disclaimer, the term of this patent is extended or adjusted under 35 U.S.C. 154(b) by 0 days.

(21) Appl. No.: 14/338,979

(22) Filed: Jul. 23, 2014

(51) Int. Cl.
 *H01L 27/24* (2006.01)
 *H01L 45/00* (2006.01)

(52) U.S. Cl.
 CPC .......... *H01L 45/1253* (2013.01); *H01L 45/146* (2013.01); *H01L 45/147* (2013.01); *H01L 45/1608* (2013.01); *H01L 45/1616* (2013.01); *H01L 45/1625* (2013.01); *H01L 27/24* (2013.01); *H01L 27/2409* (2013.01); *H01L 45/04* (2013.01); *H01L 45/1246* (2013.01)

(58) Field of Classification Search
 CPC ..... H01L 27/24; H01L 27/2409; H01L 45/04; H01L 45/1246; H01L 45/1608
 See application file for complete search history.

(56) References Cited

U.S. PATENT DOCUMENTS

| 7,791,060 | B2 |   | 9/2010 | Aochi |  |
|---|---|---|---|---|---|
| 8,120,942 | B2 |   | 2/2012 | Yamaguchi |  |
| 8,410,467 | B2 |   | 4/2013 | Wada |  |
| 8,723,150 | B2 | * | 5/2014 | Sonehara | H01L 45/12 251/1 |
| 8,860,000 | B2 | * | 10/2014 | Yamamoto | H01L 27/2409 257/1 |
| 8,872,268 | B2 | * | 10/2014 | Miller | G11C 13/0007 257/350 |
| 2011/0216575 | A1 |   | 9/2011 | Yamaguchi |  |
| 2011/0240949 | A1 | * | 10/2011 | Mitani | G11C 11/56 257/4 |
| 2011/0260228 | A1 |   | 10/2011 | Kawashima |  |
| 2012/0235111 | A1 | * | 9/2012 | Osano et al. | 257/4 |
| 2012/0267598 | A1 | * | 10/2012 | Sakotsubo et al. | 257/4 |
| 2013/0082231 | A1 | * | 4/2013 | Tada et al. | 257/4 |
| 2013/0148408 | A1 | * | 6/2013 | Kawai | G11C 13/0007 365/148 |
| 2013/0286714 | A1 | * | 10/2013 | Takagi et al. | 365/148 |
| 2013/0328006 | A1 | * | 12/2013 | Hwang et al. | 257/2 |
| 2014/0029330 | A1 | * | 1/2014 | Muraoka et al. | 365/148 |
| 2014/0061579 | A1 | * | 3/2014 | Wei et al. | 257/5 |
| 2014/0077144 | A1 | * | 3/2014 | Yoneda | 257/2 |
| 2014/0191184 | A1 | * | 7/2014 | Yamauchi et al. | 257/4 |
| 2014/0203234 | A1 | * | 7/2014 | Ninomiya et al. | 257/2 |

(Continued)

OTHER PUBLICATIONS

Lee et al.; MultiLevel Switching of TripleLayered TaOx RRAM with Excellent Reliability for Storage Class Memory; Jan. 1, 2012; 2012 Symposium on VLSI Technology Digest of Technical Papers; Unknown.

*Primary Examiner* — Ida M Soward

(57) ABSTRACT

A metal silicon oxide barrier layer between a nitride electrode containing the same metal and an oxide variable-resistance layer in a ReRAM cell prevents the metal from diffusing into the variable-resistance layer and prevents oxygen from diffusing into and oxidizing the electrode. Compound oxides of the same metal and silicon with varying stoichiometries and metal/silicon ratios may optionally replace part or all of the variable-resistance layer, a defect-reservoir layer, or both. The metal nitride electrode may include a metal silicon nitride current-limiting portion. Optionally, all the layers sharing the common metal may be formed in-situ as part of a single unit process, such as atomic layer deposition.

11 Claims, 7 Drawing Sheets

(56) References Cited

U.S. PATENT DOCUMENTS

| | | | |
|---|---|---|---|
| 2014/0225054 A1* | 8/2014 | Yoneda et al. | 257/4 |
| 2014/0278160 A1* | 9/2014 | WEI et al. | 702/58 |
| 2015/0028281 A1* | 1/2015 | Chen et al. | 257/4 |

\* cited by examiner

RERAM CELLS WITH DIFFUSION-RESISTANT METAL SILICON OXIDE LAYERS

BACKGROUND

Related fields include semiconductor devices and their fabrication; in particular, thin-film components of resistive-switching non-volatile memory (ReRAM).

Nonvolatile memory elements are used in computers and other devices requiring persistent data storage (e.g., cameras, music players). Some traditional nonvolatile memory technologies (e.g., EEPROM, NAND flash) have proven difficult to scale down to smaller or higher-density configurations. Therefore, a need has developed for alternative nonvolatile memory technologies that can be scaled down successfully in terms of performance, reliability, and cost.

In resistive-switching-based nonvolatile memory, each individual cell includes a bistable variable resistor. It can be put into either of two states (low-resistance or high-resistance), and will stay in that state until receiving the type of input that changes it to the other state (a "write signal"). The resistive state of the variable resistor corresponds to a bit value (e.g., the low-resistance state may represent logic "1" and the high-resistance state may represent logic "0"). The cell is thus written to by applying a write signal that causes the variable resistor to change resistance. The cell is read by measuring its resistance in a way that does not change it.

ReRAM cells include layers of different materials: for example, cells using oxygen-vacancy-based switching may include dielectric oxides, conductive metals or metal nitrides, and resistive ternary compounds such as metal silicon nitrides. Annealing, forming the first oxygen-vacancy filament, and subsequent long-term operation may cause atoms from one layer to diffuse into another and undesirably change its electrical properties.

For example, if metal atoms diffuse into a metal-oxide switching layer, they may distort the oxygen-vacancy filaments or form competing filaments of their own that might not easily break in response to the write signal. Metal atoms may also add conductivity to the layer so that the low-resistance state and the high-resistance state are both shifted downward and may become difficult to read.

Conversely, when oxygen diffuses into electrodes, interconnect lines and other conductive layers, it can compromise their conductivity. As a result of the added resistance, the cell may require more operating power and dissipate more waste heat. In addition, source electrodes in an oxygen-vacancy ReRAM cell are intended to donate and accept oxygen vacancies to and from the switching layer(s). If the source electrode collects too much diffused oxygen, it may become less effective at trading vacancies with other layers, and the difference between the low-resistance state and the high-resistance state may diminish, becoming more difficult to distinguish and possibly causing reading errors.

Therefore, a need exists for preventing diffusion of oxygen and metal through ReRAM cells. To accommodate continued miniaturization, the prevention of diffusion should preferably not add significant excess thickness to the cells.

SUMMARY

The following summary presents some concepts in a simplified form as an introduction to the detailed description that follows. It does not necessarily identify key or critical elements and is not intended to reflect a scope of invention.

In chemical formulae throughout this Description, "Me" represents a generic metal; any metal with suitable properties for the application may be used as well as the specific examples given. In an individual embodiment, "Me" represents the same metal in any layer where it appears; e.g., if Me=Ta in the electrode of a stack, Me also=Ta if it appears in the barrier or variable-resistance layer of the same stack. However, a different stack may have Me=Hf, Me=Ti, or some other candidate metal throughout the stack.

Diffusion of metal and oxygen between a metal-nitride ("MeN") electrode and an oxide switching stack in a ReRAM cell is blocked by a diffusion-resistant layer operable as a barrier. The diffusion-resistant layer is a compound oxide of the same metal as the electrode ("MeSiOx") and silicon. Optionally, the switching stack may also be made of MeSiOx with different values of x (e.g., a near-stoichiometric value for replacing a low-ionicity layer and a sub-stoichiometric value for replacing a high-ionicity layer).

Multiple neighboring MeN (or MeSiN) and MeSiOx variant layers may be formed in-situ in a single atomic layer deposition (ALD) chamber to streamline fabrication and reduce inter-layer contamination or other interface problems. ALD is also capable of forming well-controlled composition gradients to eliminate abrupt transitions in material properties where appropriate.

Embodiments of a ReRAM cell device using this concept may include a first layer (conductive, operable as a first electrode); a second layer (diffusion-resistant to metal and oxygen, operable as a barrier); a third layer (switchable between a high resistance state and a low resistance state, operable as a variable resistance layer); and a fourth layer (conductive, operable as a second electrode). The barrier and the variable resistance layer may be between the first electrode and the second electrode. The barrier may contact the first electrode. The first electrode may include a nitride of the metal. The barrier may include a compound oxide of the metal and silicon. The second electrode may include an oxygen-scavenging material.

For example, the metal may include hafnium, lanthanum, molybdenum, tantalum, titanium, tungsten, or zirconium. The first electrode may also include silicon. The second electrode may include titanium nitride. The variable resistance layer may include a low-ionicity material such as silicon oxide, silicon oxynitride, silicon nitride, aluminum oxide, aluminum oxynitride, hafnium oxynitride, hafnium aluminum oxide, hafnium silicon oxide, or hafnium silicon oxynitride. Optionally, the variable resistance layer and the barrier may have identical compositions.

A defect reservoir, optionally added between the variable resistance layer and the second electrode, may include mobile defects used to form a conductive filament through the variable resistance layer (e.g., oxygen or nitrogen vacancies). The defect reservoir may include a high-ionicity material such as an oxide, nitride, or oxynitride of hafnium, tantalum, titanium, or zirconium.

In some embodiments, the defect reservoir may include a compound oxide of the metal and silicon with less oxygen than the variable resistance layer. The barrier may have a composition gradient from a metal-rich MeSiOx at one interface to a balanced MeSiOx at another interface. The variable resistance layer may have a composition gradient from a Si-rich MeSiOx at one interface to silicon oxide at another interface.

In some embodiments, multiple layers of the ReRAM cell include the same metal in a nitride, oxide, oxynitride, silicon oxide, silicon nitride, or silicon oxynitride. For example, two, three, or all four of the first conductive layer, the barrier, the insulating layer, or the defect reservoir may include the metal.

Embodiments of a method for fabricating the ReRAM cell may include forming a first layer (a first conductive layer over a substrate); forming a second layer (a diffusion-resistant layer over the first conductive layer); forming a third layer (an insulating layer over the diffusion-resistant layer); and forming a fourth layer (a second conductive layer over the insulating layer). The first conductive layer may include a nitride of a metal. The diffusion-resistant layer may include a compound oxide of the metal and silicon. The insulating layer may include a near-stoichiometric oxide, nitride, or oxynitride. The second conductive layer may include an oxygen-scavenging material.

The forming of the diffusion-resistant layer may include deposition techniques such as atomic layer deposition (ALD), physical vapor deposition (PVD), or chemical vapor deposition (CVD). As an example, atomic layer deposition may expose the substrate to alternating pulses of metal chloride, water, silicon precursor, and water in a process chamber, and the process chamber may be purged after every pulse. Optionally, the method may include the forming of a defect reservoir layer, with enough intrinsic defects to form a conductive filament through itself and the insulating layer, may be formed over the insulating layer and under the second conductive layer. The forming of the defect reservoir may include forming a gradient of the metal or a gradient of silicon. Alternatively, the gradient of the metal or silicon may be formed in the diffusion-resistant layer or the insulating layer.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE

Embodiments

Figure 1A:
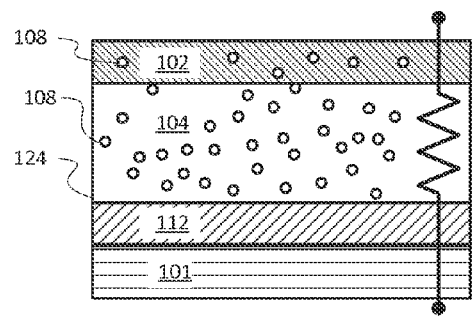
FIGS. 1A and 1B conceptually illustrate initial filament formation in the variable-resistance layer of a ReRAM cell.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

As used herein, the following terms shall have the following meanings unless associated text or context indicates an exception:

"A," "an," and singular nouns: May include plural variations, e.g., "a layer" may mean "one or more layers."

"About" or "approximately": Within ±10% variation.

"Above" and "over": Either directly contacting or separated by intervening elements; may conform to an underlying 3D structure.

"Amorphous": Exhibits less than 30% crystallinity as measured by a technique such as x-ray diffraction (XRD).

"Atomically smooth": Having rms surface roughness of ≲2.5 nm.

"Between" (range of values): Both boundary values and any value between the boundaries can be within the scope.

"Conductive:" Resistivity<1e-5 Ω·m at the intended operating temperature.

"Covalent" or "low-ionicity" (material): at least 55% of the bonds in the material are covalent.

"Crystalline": Exhibits at least 30% crystallinity as measured by a technique such as x-ray diffraction (XRD).

"Diffusion-resistant," "diffusion barrier": Having a diffusion coefficient <1e-9 $cm^2$/sec for the diffusing material.

"Film" and "layer": Interchangeably describe a portion of a stack; may include multiple sub-layers (e.g., a nanolaminate).

"First," "second," and other ordinals: For differentiation only, rather than imposing any specific spatial or temporal order.

"High-k material," "high-k layer," "high-k dielectric" (interchangeable): A material or layer with a dielectric constant ("k") greater than 9.

"Identical" (composition of compound): Within ±10 atomic %.

"In situ": Without an intervening vacuum break or other exposure to an uncontrolled environment; in the same process chamber as a previous process, or in another chamber with vacuum access to the chamber used for the previous process (e.g., in a multi-chamber cluster tool).

"Insulating" or "dielectric": Resistivity >1e8 Ω·m at the intended operating temperature.

"Ionic" or "high-ionicity" (material): At least 55% of the bonds in the material are ionic.

"Low-ionicity" (material): Less than 55% of the bonds in the material are ionic.

"Low-defect layer": Having too few intrinsic mobile defects to form a conductive filament through the entire thickness of the layer in response to a forming field.

"Metal nitride": Comprising nitrogen and one or more metals or semiconductors.

"Monolayer": A single layer of atoms or molecules covering a surface, with substantially all available bonding sites satisfied and substantially all individual members of the adsorbed species in direct physical contact with the underlying surface.

"Near-stoichiometric": Within ±10% of stoichiometric.

"Operable" (for a specific purpose): Would satisfactorily fulfill that purpose given suitable connections, signals, or other external conditions.

"Or" in a list: Any, all, or any subset of list may be used.

"Oxide" (of an element): May include additional components besides the element and oxygen, including but not limited to a dopant or alloy.

"Sub-monolayer" or "pre-wetting layer": Partial or incomplete monolayer; maximum thickness is one atom or molecule, but not all available bonding sites on the surface are covered, so that the average thickness is less than one atom or molecule.

"Substantially": Within up to ±5% variation.

"Sub-stoichiometric": Less than 90% stoichiometric (e.g., if $XO_2$ is stoichiometric, $XO_{1.8}$ and $XO_{1.5}$ are sub-stoichiometric.

"Substrate": A wafer or any other workpiece on which formation or treatment of material layers is desired. Non-limiting examples include silicon, germanium, silica, sapphire, zinc oxide, SiC, AlN, GaN, Spinel, silicon on oxide, silicon carbide on oxide, glass, gallium nitride, indium nitride and aluminum nitride, glasses, combinations or alloys thereof, and other solid materials.

"Surface": Boundary between the ambient environment and a feature of the substrate.

"Variable resistance" (in a ReRAM resistive-switching layer): Resistance that is reversibly switched between at least two stable states by "write" signals, but remains approximately constant in response to "read" signals.

"Vertical": In a direction perpendicular to a nominally planar surface of the substrate.

Figure 1B:
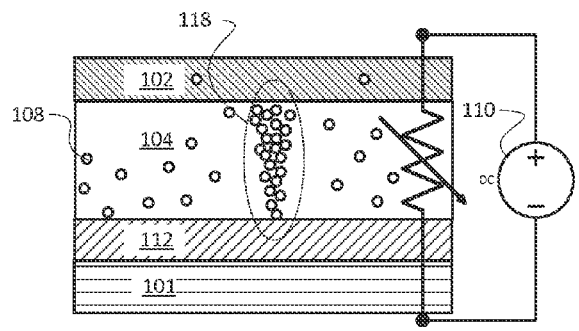

FIGS. 1A and 1B conceptually illustrate initial filament formation in the variable-resistance layer of a ReRAM cell. FIG. 1A is a schematic representation of layers in a ReRAM cell before any filaments are formed. Although some ReRAM cells include additional layers, the illustration is simplified to show only substrate 101 (which may include other structures and layers), electrodes 102 and 112, and VR layer 106 between the electrodes. Electrodes 102 and 112 are generally conductive layers, although the conductivity may sometimes be less than that of typical electrodes in other devices. In such embodiments, a current-limiting embedded resistor may be integrated with one or both of the electrodes to prevent over-forming.

In this example, first electrode 102 is a reactive or "source" electrode that may act as a source or reservoir of electrically active defects 108. In this example, second electrode 112 is an inert electrode that does not react with, or exchange material or defects with, VR layer 106. In some embodiments, the first electrode may be inert and the second electrode may be reactive. Inert electrodes may be made of inert materials (e.g., noble metals) or may be rendered inert by a barrier layer between the electrode and the VR layer (e.g., polycrystalline silicon with a silicon oxide barrier layer). Reactive electrodes may be made of any sufficiently conductive material that provides the desired mobile defects; for example, titanium nitride for oxygen vacancies, or silver or copper for metal ions.

Defects 108 may travel through "reactive interface" 126 between reactive electrode 102 and VR layer 106, e.g., when mobilized by an electric field from an applied voltage. Defects 108 may be, by way of non-limiting example, metal ions, vacancies (e.g., oxygen vacancies), interstitial atoms, or stress-induced lattice dislocations. Either alternatively or in addition, VR layer 106 may be formed with defects 108. If sufficient defects to form a filament are available in VR layer 106, both electrodes may be inert electrodes. VR layer 106 may be a high-k or low-k dielectric, a dielectric stack or, in some embodiments, a low-conductivity semiconductor. With no filament formed, the position, number, and distribution of defects 108 is not conducive to electron tunneling between first electrode 102 and second electrode 112.

In FIG. 1B, a voltage source 110 applies a forming-voltage pulse to electrodes 102 and 112, mobilizing defects 108 to form a filament 118 in VR layer 106. The defects may be gathered from an original distribution throughout the bulk of VR layer 106, or they may enter VR layer 106 from a reactive electrode 102 (or some other type of defect-access layer), or they may be created in VR layer 106 by interaction of the electric field with another feature of the material, or any combination. In filament 118, the defects are sufficiently close together that electrons may tunnel from defect to defect through the VR layer from one electrode to the other. In some embodiments, the forming operation includes heating to enhance mobility of the defects within ReRAM cell 100.

In general, the forming operation is a one-time fabrication step that converts the original dielectric of VR layer 106 to a variable resistive material. Afterward, in operating the ReRAM cell, a lesser "reset" voltage may be applied to break at least the weak part of the filament and raise the resistance of the VR layer to a high resistance state (HRS); a lesser "set" voltage may be applied to restore the broken part of the filament and lower the resistance of the VR layer to a low resistance state (LRS); and an even lesser "read" voltage may be applied to sense the resistance of the VR layer without changing it. Moving, creating, or destroying the defects requires energy, but leaving them in place does not; therefore, the VR layer is non-volatile, retaining its written LRS or HRS state if the cell is unpowered. In some embodiments, the resistance values of the HRS and LRS are repeatable within ±20% or less.

Figure 2:
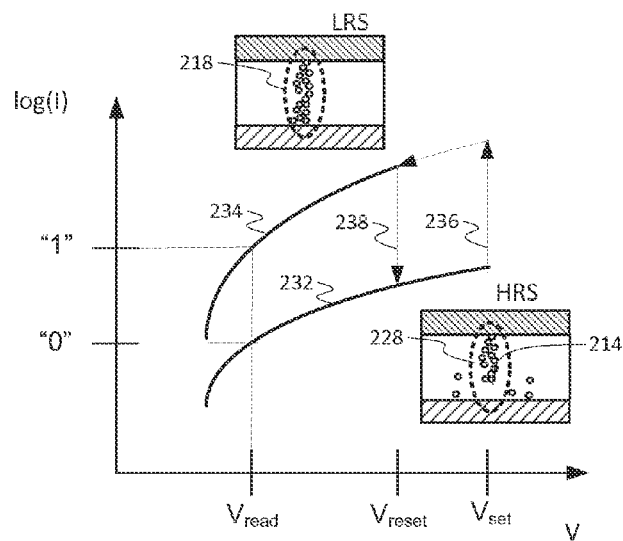
FIG. 2 is an example I-V plot for reading and writing a ReRAM cell.

FIG. 2 is an example I-V plot for reading and writing a ReRAM cell. Specifically, FIG. 2 is a plot of current passing through a unipolar ReRAM cell as a function of applied voltage according to some embodiments. The cell's response when the VR layer is in its HRS, with a broken filament 228, is plotted as curve 232. The cell's response when the VR layer is in its LRS, with a restored filament 218, is plotted as curve 234.

With two possible resistive states, the cell can store one bit of data. Some ReRAM cells may have three or more resistance states to enable multi-bit storage in a single cell. To change the stored value, a write voltage $V_{SET}$ or $V_{RESET}$ is applied to the cell. $V_{RESET}$ breaks complete filament 218 at some break point 214 into broken filament 228, and $V_{SET}$ restores broken filament 228 to a complete filament 218. In a unipolar cell as illustrated here, $V_{SET}$ and $V_{RESET}$ have the same polarity. In a bipolar cell, $V_{SET}$ and $V_{RESET}$ have opposite polarities.

To read the stored value, a sensing or "read" voltage $V_{READ}$ is applied across the cell and the output current is measured. Because of Ohm's law, V=IR, for a given $V_{READ}$ the output current I depends on the cell resistance R, which depends on whether the VR layer is in its LRS or its HRS. In the illustrated example, the LRS corresponds to logic "1" and the HRS corresponds to logic "0," although some embodiments may reverse the correspondences.

ReRAM cells may be switched between LRS and HRS (rewritten) many times. Between switching events, any number of read operations may be performed. In some embodiments, the set voltage ($V_{SET}$) is between about 100 mV and 10V; e.g., between about 500 mV and 5V. The length of set voltage pulses ($t_{sET}$) may be less than about 100 milliseconds, less than about 5 milliseconds, or less than about 100 nanoseconds. The read voltage ($V_{READ}$) may be between about $\frac{1}{10}$ and $\frac{1}{2}$ of $V_{SET}$. In some embodiments, the currents sensed during read operations are greater than about 1 mA, or even greater than about 5 mA to allow for a fast detection of the logic state by small sense amplifiers. The length of a read voltage pulse ($t_{READ}$) may be comparable to the length of a set voltage pulse ($t_{sET}$) or may be shorter. ReRAM cells preferably can switch between LRS and HRS at least about $10^3$ times or, more desirably at least about $10^7$ times without failure. They preferably retain their data for at least about 5 years or, more desirably, at least about 10 years at temperatures up to 85° C. under constant application of $V_{READ}$. In some embodiments, low current leakage, such as less than about 40 A/cm² measured at 0.5 V per 20 Å of oxide thickness in HRS, may also be preferred.

The repeatability of the LRS and HRS resistance values, which affects the reading accuracy, partially depends on the physical similarities between successive complete filaments 218, and on the physical similarities between successive broken filaments 228. In the single monolithic switching layer illustrated in FIGS. 1 and 2, nothing reliably prevents the filament break-point 214 from occurring in a different position after each reset event, or prevents the complete filaments 218 from forming with different shapes or density profiles after each set event. These variations cause the LRS and HRS resistance values to vary. Similarly, nothing ensures that one cell in an array has the same LRS or HRS resistance as its neighbors. These error sources add constraints to the HRS-LRS difference; it must be large enough that the variations will not cause misreading.

By deliberately creating a weak point at which the filament is always most likely to break, and providing that only a small portion of the filament needs to be re-formed, these error sources may be reduced and the system may be able to tolerate a smaller HRS-LRS difference. One approach is to replace the monolithic switching layer with a stack having a significant discontinuity of an electrical or physical property at an internal interface. This internal interface then becomes by far the most likely break point for every reset event. Because it is dictated by the thickness of the layers in the switching stack, it can be made highly consistent from cell to cell.

Figure 3A:
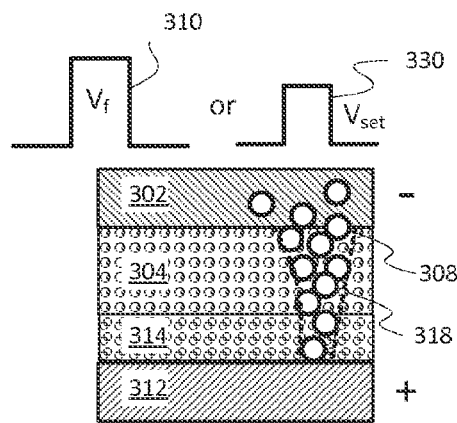
FIGS. 3A and 3B conceptually illustrate oxygen-vacancy filament behavior in a switching bi-layer.
Figure 3B:
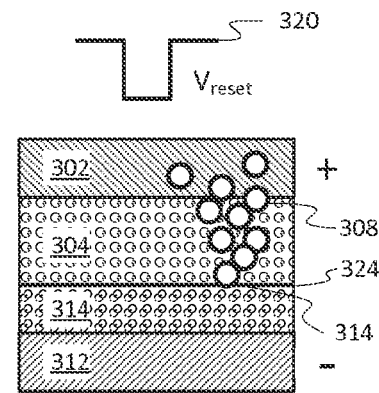

FIGS. 3A and 3B conceptually illustrate oxygen-vacancy filament behavior in a switching bi-layer. In FIG. 3A, forming pulse 310 or set pulse 330 has been applied. This pulse drives oxygen vacancies 308 from source electrode 302 into high-ionicity layer 304, which readily accepts them and, depending on the high-ionicity material, may have its own intrinsic vacancies to move into the filament. Because most of the path for filament 318 is through high-ionicity layer 304, the stack takes advantage of the easy filament formation of the high-k material in the high-ionicity layer. Often the high-ionicity, high-k materials partially crystallize after annealing, providing grain boundaries through which oxygen vacancies can travel. The formation of filament 318 slows when it encounters the defect-resistant low-ionicity layer, which acts as a brake to prevent overshoot and possible damage to inert electrode 312 (e.g., it may remain amorphous after annealing and provide no grain boundaries). As a result, the filament may be thinner or more tapered in low-ionicity layer 314 than it would have been in a similar thickness of high-ionicity layer 304 or a layer of a different high-ionicity high-k material. Because low-ionicity layer 314 is thinner than high-ionicity layer 304, the portion of the filament passing through it will be relatively short.

The division of voltage between high-ionicity layer 304 and low-ionicity layer 314 depends on the layers' relative resistivity. Physical thickness, dielectric constant (k), and the density of oxygen vacancies or other defects all influence the relative resistivity. Since low-ionicity layer 314 is selected for low k and low defect density, it has a high effective oxide thickness (EOT) despite its small physical thickness. Therefore, most of the total voltage applied to the stack by forming, set, or reset may be localized to low-ionicity layer 314. Thus the strongest electric field may be concentrated, and the most heat dissipated, in low-ionicity layer 314.

In FIG. 3B, a reset pulse 320 has been applied. The high dielectric constant and/or small number of oxygen vacancies in low-ionicity layer 314 confines the electric field and heat from reset pulse 320 to the small part of the filament in that layer. Because of the interface discontinuity between the low-ionicity and high-ionicity layers, and the greater conductivity of the high-ionicity layer, the reset pulse can apply sufficient field strength and heat to destroy the small part of the filament in the low-ionicity layer with little to no effect on the part of the filament in the high-ionicity layer. The next set pulse only has to reconstitute the small part of the filament in thin low-ionicity layer 314, rather than a larger or unpredictably sized portion. Thus, after the first filament is formed, high-ionicity layer 304 acts as a defect reservoir, storing some oxygen vacancies near where they need to be moved by the next set pulse. Most of the drastic changes in oxygen-vacancy distribution during repeated switching become localized in low-ionicity layer 314, conferring the advantages of low operating power and good data retention.

Because of the discontinuity in material properties between the high-ionicity and low-ionicity switching layers (e.g., ionic vs. covalent, crystalline vs. amorphous, high-k vs. low-k), filament break-point 314 occurs at the natural weak point at bi-layer interface 324. The location of the interface, and thus of break-point 314, is controllable by controlling the thickness of the layers. Compare this to break-point 214 in FIG. 2, which may form anywhere in the bulk of the single switching layer and may not be repeatable or consistent from cell to cell. The bi-layer potentially offers less variation in the results of reading, from one switching event to another and from one cell to another.

ReRAM cells require both conductive and insulating materials, functioning at close quarters in a compact stack. Diffusion from either type of layer into the other during fabrication or operation can cause unreliability and sometimes even complete failure.

Figure 4A:
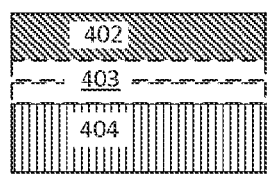
FIGS. 4A-C conceptually illustrate metal and oxygen diffusion with and without a diffusion barrier.
Figure 4B:
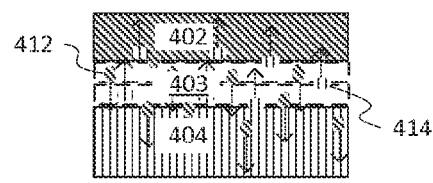
Figure 4C:
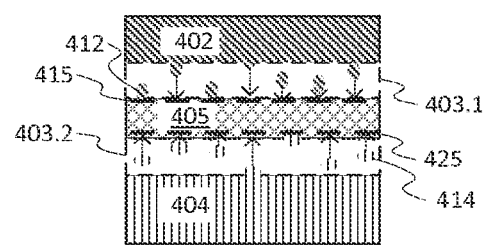

FIGS. 4A-C conceptually illustrate metal and oxygen diffusion with and without a diffusion barrier. As shown in FIG. 4A, many thin-film electronic devices have at least one conductor 402 and at least one insulator 404. They may be in direct contact or may be separated by one or more intervening element(s) 403. Conductor 402, insulator 404, and intervening element(s) 403 may be layers, partial layers, or other structures such as vias or doped regions. Although the illustration shows conductor 402 above insulator 404, they may be arranged in any relative orientation.

FIG. 4B shows a common failure mode of thin-film electronic devices. When heated, as during diode activation or other annealing, or eventually over long periods of time, metal atoms 412 may diffuse out of conductor 402 and oxygen atoms 414 may diffuse out of insulator 404. (For simplicity, the illustration shows diffusion in a vertical direction, but diffusion can occur in any direction.)

As metal atoms 412 diffuse into insulator 404, insulator 404 becomes more conductive and less insulating. Eventually the conductivity of insulator 404 may rise enough to conduct current between device elements separated by insulator 404 (not shown), creating an unwanted short circuit between the device elements and causing the device to fail. Similarly, as oxygen atoms 414 diffuse into conductor 402, metal in conductor 402 becomes oxidized. Oxidation makes conductor 402 less conductive and more insulating. Eventually the conductivity of conductor 402 may fall enough to stop conducting current between device elements connected by conductor 402 (not shown), creating an unwanted open circuit between the device elements and causing the device to fail.

Another potential effect of diffusion particular to switching layers or stacks in ReRAM cells is the formation of competing filaments. As mentioned above, some cells form filaments from metal impurity atoms and others use oxygen vacancies. If both types of defects are present in the same switching stack, the write signals will tend to induce both types to form and break filaments. All of the care taken to control oxygen vacancy density in the switching stack may not produce the desired control over switching if metal randomly diffuses into the switching stack and begins to make filaments of its own.

FIG. 4C illustrates the function of a barrier. Barrier 405, which like the other elements may be a layer, partial layer, or other structure, is interposed somewhere between conductor 402 and insulator 404. The material of barrier 405 is selected to have a high diffusion coefficient ($>=$1e-9 cm$^2$/sec) for both the metal atoms and the oxygen atoms. There may or may not be one or more intervening element(s) 403.1 (between conductor 402 and barrier 405) or 403.2 (between barrier 405 and insulator 404). If metal atoms 412 diffuse out of conductor 402, they are trapped at level 415 on or in barrier 405. Because metal atoms 412 cannot reach insulator 404, insulator 404 retains its insulating properties. Thus the risk of device failure by a short circuit through insulator 404 is reduced. If oxygen atoms 414 diffuse out of insulator 404, they are trapped at level 425 on or in barrier 405. Because oxygen atoms 414 cannot reach conductor 402, conductor 402 retains its conducting properties. Thus the risk of device failure by an open circuit in conductor 402 is reduced. Limiting levels 415 and 425 may be near the surfaces of barrier 405, as illustrated, or inside barrier 405, as long as metal atoms 412 and oxygen atoms 414 are highly unlikely to escape through the far surface of barrier 405 during the lifetime of the device. Barrier thicknesses can be on the order of nm to μm, with some materials functioning well at sub-nanometer thicknesses.

FIGS. 5A-G conceptually illustrate example film stacks. Although not shown in the drawings, interfacial layers may be present. The illustrated thicknesses are not to scale.

Figure 5A:
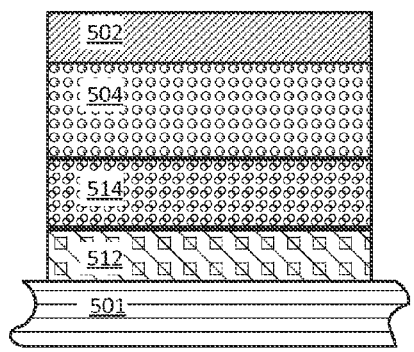
FIGS. 5A-G conceptually illustrate example film stacks.

FIG. 5A is a ReRAM cell with a bi-layer switching stack without a barrier, for reference. Substrate 501 may include previously fabricated layers or structures, such as interconnect layers or other device layers. Low-ionicity layer 514 has few intrinsic defects. High-ionicity layer 504, reactive electrode 502, or both may have enough intrinsic mobile defects to form a filament through high-ionicity layer 504 and low-ionicity layer 514. Non-reactive electrode 512 is a nitride of a metal, e.g., TaN, MoN, or WN (generically "MeN"). Low-ionicity layer 514 may be silicon oxide, silicon oxynitride, silicon nitride, aluminum oxide, aluminum oxynitride, hafnium oxynitride, hafnium aluminum oxide, hafnium silicon oxide, or hafnium silicon oxynitride. High-ionicity layer 504 may be an oxide, nitride, or oxynitride of hafnium, tantalum, titanium, or zirconium. Reactive electrode 502 may include an oxygen-scavenging material, such as titanium nitride, to remove oxygen and create mobile oxygen-vacancy defects in high-ionicity layer 504.

Figure 5B:
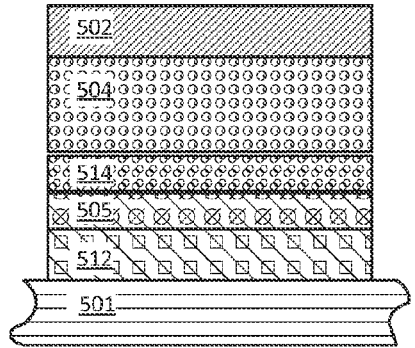

FIG. 5B is a ReRAM cell with a barrier added under a bi-layer switching stack. Barrier 505 is a stoichiometric or near-stoichiometric MeSiO$_{x1}$, a metal silicon oxide incorporating the same metal as MeN electrode 512. Because the metal in MeSiO$_{x1}$ is bound more tightly than the metal in MeN, there will be no metal diffusion into low-ionicity layer 514. Because the oxygen in MeSiO$_{x1}$ is bound more tightly than the oxygen in low-ionicity layer 514, there will be no oxidation of electrode 512. In some embodiments, low-ionicity layer 514 may have a reduced thickness when a barrier is present, compared to when a barrier is not present.

Figure 5C:
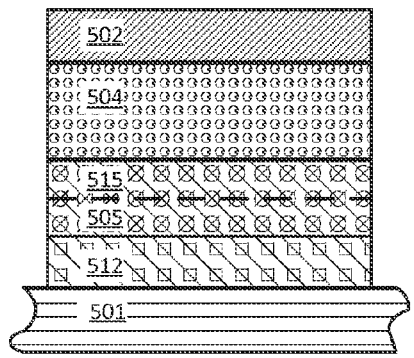

In FIG. 5C, low-ionicity layer 514 has been replaced by MeSiO$_{x2}$ layer 515, another compound oxide of silicon and the same metal used in the electrode. Layers 505 and 515 may have the same proportions of the metal and silicon as each other, or they may not. They may have the same oxygen content ($x_1=x_2$) or not. Preferably, layer 515 has sufficient oxygen that, like the low-ionicity layer 514, it has few intrinsic mobile defects so that its low and high resistance states will be highly distinguishable and stable over long periods of time.

Figure 5D:
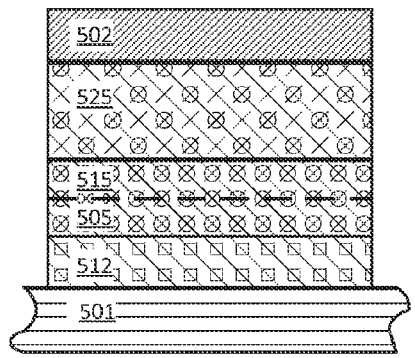

In FIG. 5D, high-ionicity layer 504 has been replaced by low-oxygen, high-defect MeSiO$_y$ layer 525, yet another silicon oxide of the same metal as the electrode. Layer 525 is preferably sub-stoichiometric or otherwise oxygen-starved (i.e., $y<x_1$ and $y>x_2$) so that, like high-ionicity layer 504, it can act as a defect reservoir supplying mobile defects to form a filament through low-defect layers 515 and/or 505 in response to a forming or set pulse.

Figure 5E:
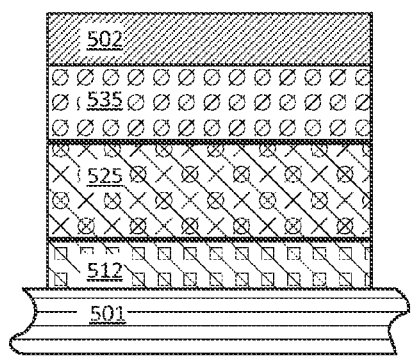
Figure 5F:
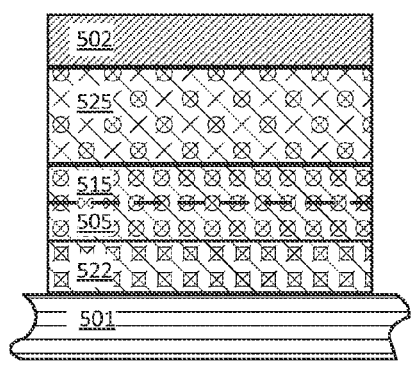

In FIG. 5E, the low-oxygen, high-defect MeSiO$_y$ layer 525 is in contact with the MeN electrode 512. Between low-oxygen, high-defect MeSiO$_y$ layer 525 and reactive electrode 502 is a low-defect silicon oxide layer 535, such as SiO$_2$. During forming or write operations, reactive electrode 502 may or may not move some oxygen into or out of low-defect layer 535. For thin low-defect layers (e.g., <10 nm), the oxygen transfer may not affect the filament break-point, In FIG. 5F, the switching/barrier stack 505, 515, 525 is similar to 5D, but MeN electrode 512 has been replaced by MeSiN current-limiting electrode (CLE) 522. MeSiN CLE 522 may replace MeN electrode 512 in any embodiment of the switching/barrier stack. Alternatively, a separate MeSiN embedded resistor (same metal as the MeN electrode, or a different one) may be included between MeN electrode and barrier 505. In addition, any of these stacks can be fabricated in inverse order (e.g., reactive electrode on the bottom, then the defect reservoir layer, then the low-defect layer, then the barrier, then the non-reactive electrode) without straying from the scope of this description.

Figure 5G:
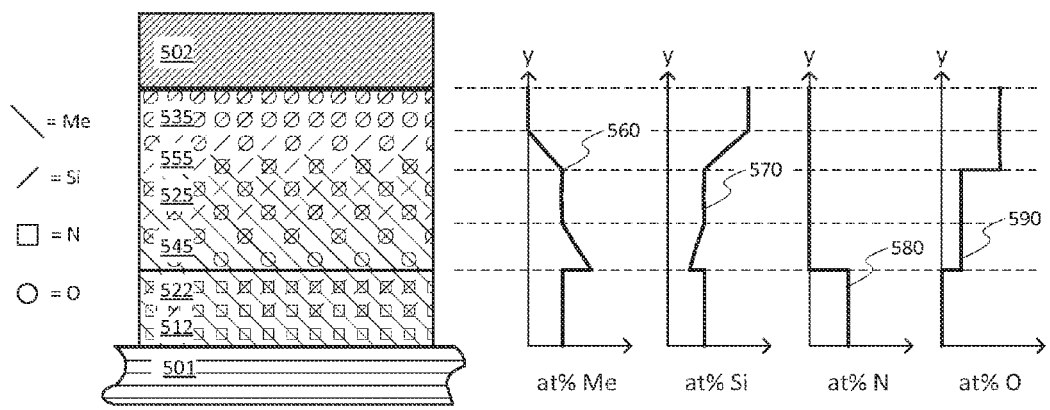

FIG. 5G demonstrates a ReRAM cell with composition gradients in a non-reactive electrode/barrier/switching stack of layers that share a common metal. The MeN electrode 512 may introduce a gradient of Si for a current-limiting MeSiN region 522. The barrier and switching stack may have a gradient from a metal-rich low-oxygen MeSiO$_y$ region 545 to a balanced low-oxygen MeSiO$_y$ region 525 to a silicon-rich low-oxygen MeSiO$_y$ region 525 to a fully-oxygenated SiO$_2$ low-defect region 535. The metal Me is shared by every layer in the stack except source electrode 502. The gradient for the relative atomic percentage (at %) of each element vs. height y above the substrate is conceptually demonstrated (normalized to a maximum and not to scale) by curve 560 for the metal, curve 570 for silicon, curve 580 for nitrogen, and curve 590 for oxygen.

ALD, producing a self-limiting monolayer or sub-monolayer on the substrate at each cycle, can produce very well-controlled gradients and fine-pitch nanolaminates for gradual transitions of composition where desired.

Figure 6:
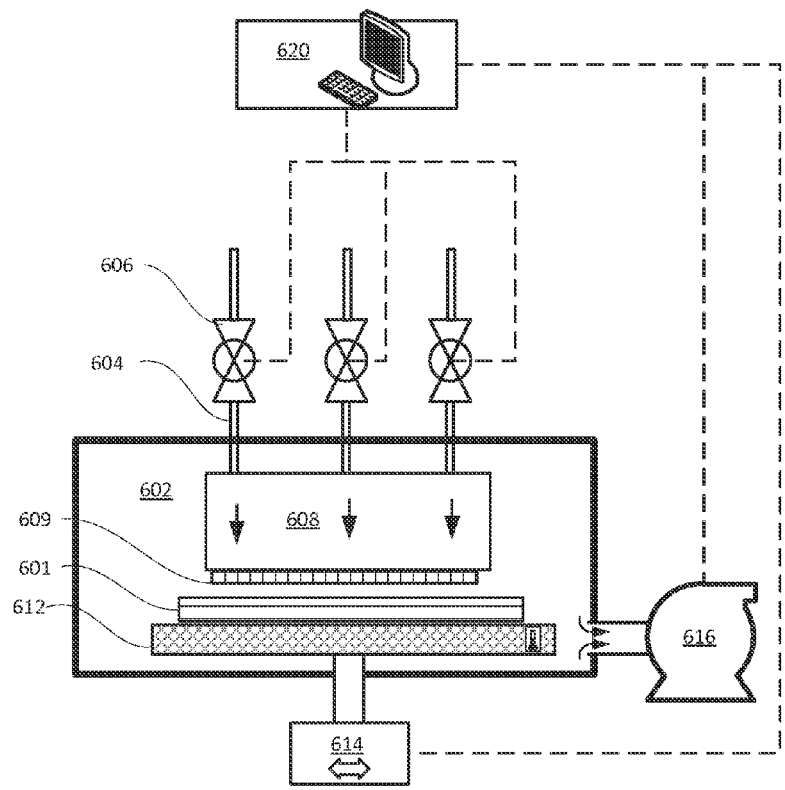
FIG. 6 is a block diagram of an example ALD apparatus.

FIG. 6 is a block diagram of an example ALD apparatus. For clarity, some components that may be included with some ALD chambers, such as a substrate-loading port, substrate lift pins, and electrical feedthroughs, are not shown. Environmentally-controlled process chamber 602 contains substrate holder 612 to hold substrate 601 for processing. Substrate holder 612 may be made from a thermally conducting metal (e.g., tungsten, molybdenum, aluminum, nickel) or other like materials (e.g., a conductive ceramic) and may be temperature-controlled. Drive 614 may move substrate holder 612 (e.g., translate or rotate in any direction) during loading, unloading, process set-up, or sometimes during processing.

Process chamber 602 is supplied with process gases by gas delivery lines 604 (although three are illustrated, any number of delivery lines may be used). A valve and/or mass flow controller 606 may be connected to one or more of delivery lines 604 to control the delivery rates of process gases into process chamber 602. In some embodiments, gases are routed from delivery lines 604 into process chamber 602 through delivery port 608. Delivery port 608 may be configured to premix the process gases (e.g., precursors and diluents), shape the distribution of the process gases over the surface of substrate 601, or both. Delivery port 608, sometimes called a "showerhead," may include a diffusion plate 609 that distributes the process gases through multiple holes. Vacuum pump 616 exhausts reaction products and unreacted gases from, and maintains the desired ambient pressure in, process chamber 602.

Controller 620 may be connected to control various components of the apparatus to produce a desired set of process conditions. Controller 620 may include one or more memory devices and one or more processors with a central processing unit (CPU) or computer, analog and/or digital input/output connections, stepper motor controller boards, and the like. In some embodiments, controller 620 executes system control software including sets of instructions for controlling timing, gas flows, chamber pressure, chamber temperature, substrate temperature, radio frequency (RF) power levels (if RF components are used, e.g., for process gas dissociation), and other parameters. Other computer programs and instruction stored on memory devices associated with controller 620 may be employed in some embodiments.

ALD films, being deposited in monolayers, often exhibit smoother surfaces than layers made by other methods. For example, an ALD layer may have a surface roughness less than 0.3 nm rms (measured by, e.g., atomic force microscopy).

Figure 7:
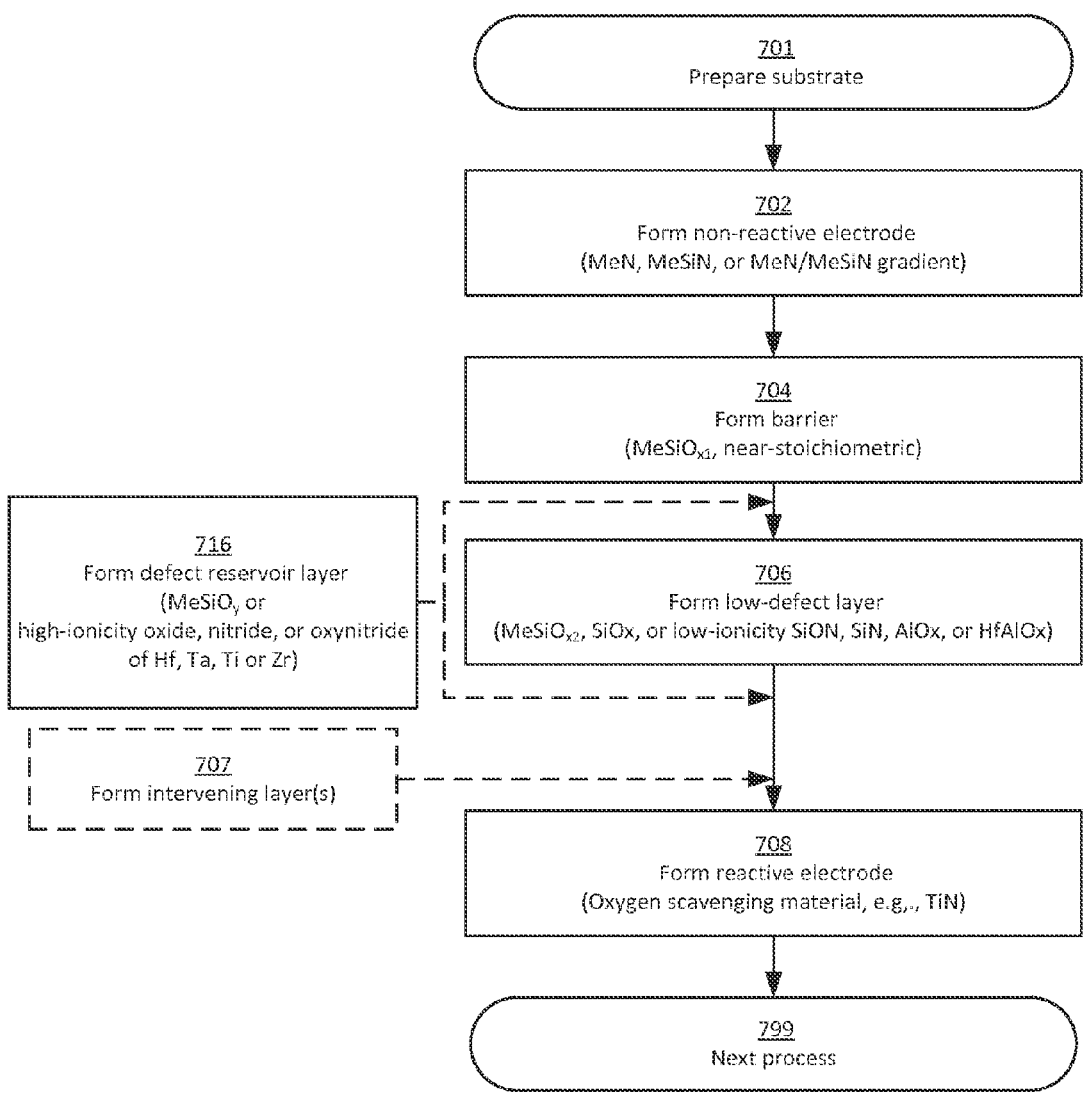
FIG. 7 is a flowchart of an example process for fabricating a ReRAM cell with a barrier.

FIG. 7 is a flowchart of an example process for fabricating a ReRAM cell with a barrier. Step 701 of preparing the substrate may include cleaning, degassing, other treatments, or the formation of layers and structures that precede those formed by this process. Step 702 of forming a non-reactive electrode over the substrate may include forming a nitride of a metal (MeN), a metal silicon nitride (MeSiN), or a gradient of MeN and MeSiN. Step 704 of forming a barrier over the non-reactive electrode may include forming a compound oxide of the metal and silicon ($MeSiO_{x1}$), for example by atomic layer deposition.

Step 706 of forming a low-defect layer over the barrier may include the forming a near-stoichiometric compound oxide of the metal and silicon ($MeSiO_{x2}$) or a low-ionicity oxide, nitride, or oxynitride of a different material. Step 716 of forming a defect reservoir may be done before or after step 706 of forming the low-defect layer, depending on the embodiment. In some embodiments, forming the defect reservoir may include forming a sub-stoichiometric or oxygen-starved compound oxide of the metal and silicon ($MeSiO_y$), or forming a high-ionicity oxide, nitride, or oxynitride of Hf, Ta, Ti or Zr.

Step 708 of forming the reactive electrode over the topmost layer of the switching stack (which may be the low-defect layer, the defect reservoir layer, or an intervening layer formed in optional step 707) may include forming an oxygen-scavenging material such as TiN. Afterward, next step 799 may commence.

Figure 8:
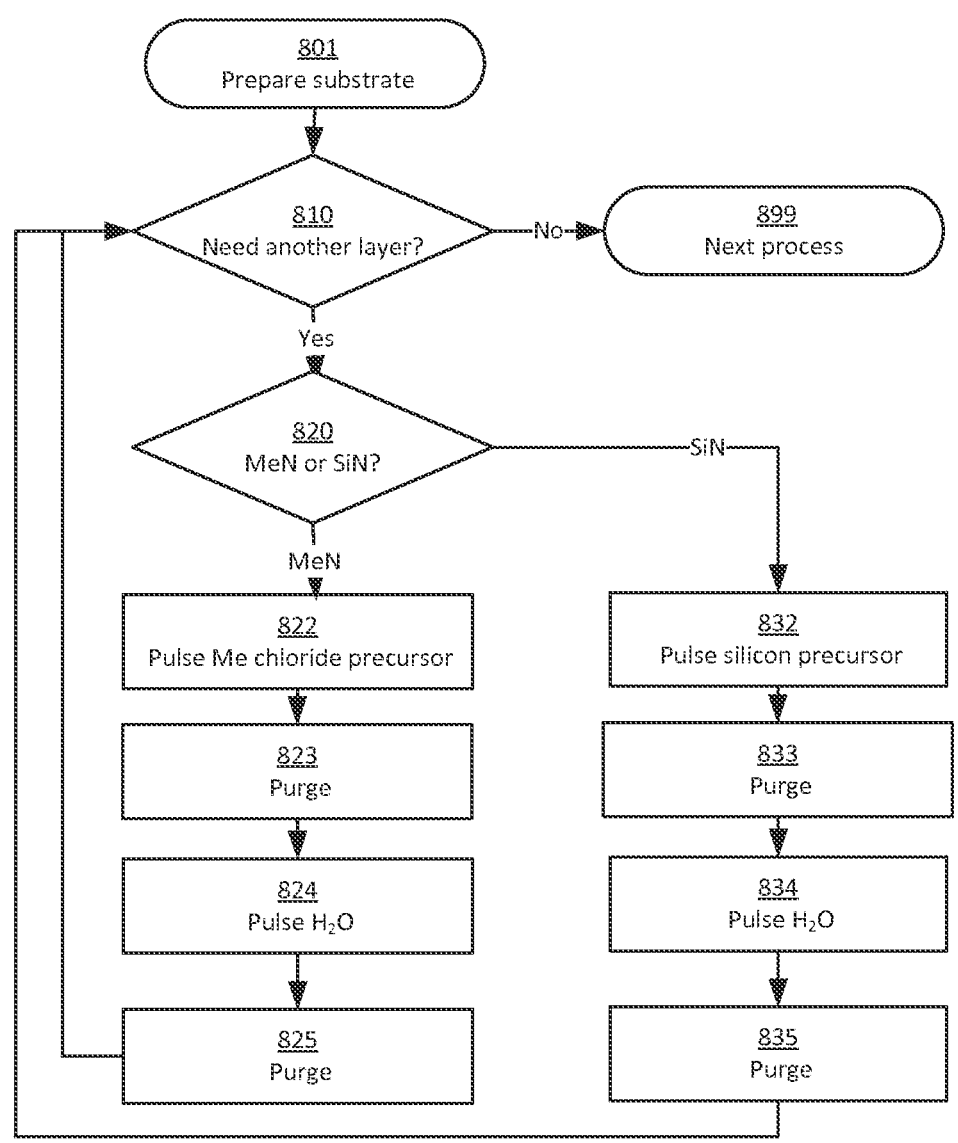
FIG. 8 is a flowchart of an example process for forming a MeSiOx layer by constructing a MeOx-SiOx nanolaminate.

FIG. 8 is a flowchart of an example process for forming a $MeSiO_x$ layer by constructing a $MeO_x$—$SiO_x$ nanolaminate. Step 801 of preparing a substrate may include cleaning, degassing, forming underlying layers or structures, or treating the underlying layers or structures. If, at decision 810, an additional nanolaminate layer is desired (which will be "Yes" for at least the first two layers), the process branches at decision 820 depending on whether a $MeO_x$ layer or a $SiO_x$ layer is to be formed.

Forming a $MeO_x$ layer may include step 822 of pulsing a metal chloride precursor for the metal Me, step 823 of purging the chamber (e.g., with $N_2$ or Ar), step 824 of pulsing water vapor, and step 825 of purging the chamber. Forming a $SiO_x$ layer includes step 832 of pulsing a silicon precursor, step 833 of purging the chamber, step 834 of pulsing water vapor, and step 835 of purging the chamber. To form an oxygen-starved $MeSiO_y$ layer, the water vapor pulses 824 and 834 may be shorter in duration or lower in pressure so that less than all the metal and/or silicon deposited on the substrate has the opportunity to oxidize.

After forming a $MeO_x$ or $SiO_x$ layer, the process returns to branch 810 to determine whether enough layers have been deposited to reach the desired thickness. If the desired thickness is reached, decision 810 is "No" and next process 899 may commence. Next process 899 may include forming an overlying or a treatment such as patterning or annealing.

While forming the nanolaminate layers, the chamber pressure may be between about 0.1 Torr and 2 Torr and the substrate temperature may be between 200-450 C, within a range compatible with use of all the precursors. For example, if the reaction forming $SiO_2$ is optimal at 400 C but the reaction forming $HfO_2$ is optimal at 275 C, the nanolaminate of the two may be formed at 350-375 C. The metal chloride precursor may include bis(trimethylsilyl)amidohafnium(IV) chloride, molybdenum (V) chloride, bis(cyclopentadienyl)molybdenum(IV) dichloride, tantalum (V) chloride, bis(tert-butylcyclopentadienyl)titanium(IV) dichloride, tungsten (VI) chloride, tungsten hexafluoride, or bis(cyclopentadienyl)tungsten(IV) dichloride. The silicon precursor may include tris[dimethylamino]silane (3DMAS). The pulse length may be between about 0.1 and about 1 second. The desired thickness may be 2-10 nm. A similar approach may be used to fabricate a TaSiN CLE, using $N_2$ as the reactant instead of the water vapor in steps 824 and 834.

Figure 9A:
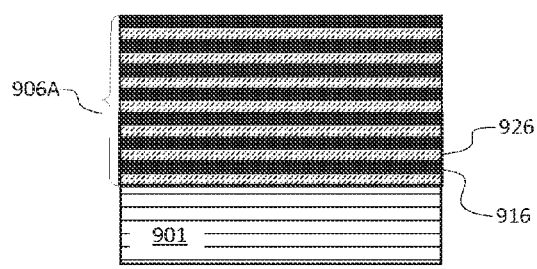
FIGS. 9A-D conceptually illustrate some examples of compound layers constructed from nanolaminates.
Figure 9B:
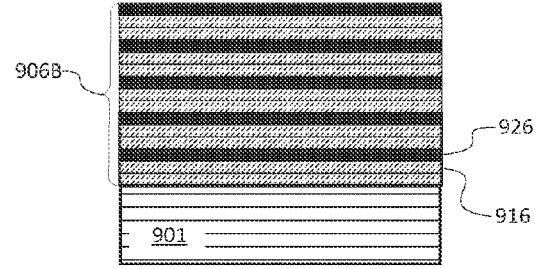
Figure 9C:
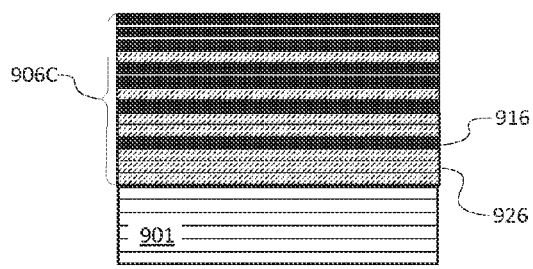

FIGS. 9A-C conceptually illustrate some examples of compound layers constructed from nanolaminates. Layer distribution, for example of ALD monolayers, may be used to adjust the local Me/Si ratio in a layer or stack that includes $MeSiO_x$ or MeSiN. Substrate 901 may include layers or structures underlying the $MeSiO_x$ or MeSiN nanolaminate. In FIGS. 9A and 9B, metal-containing layers 916 and silicon-containing layers 926 are uniformly distributed throughout nanolaminate 906A. If the layers are very thin (e.g., <0.5 nm), the nanolaminate performs like a uniform layer with a Me/Si ratio proportional to the ratio of the combined thickness of Me layers to the combined thickness of Si layers. In FIG. 9A, the Me/Si ratio of nanolaminate 906A is about 1:1; in FIG. 9B, the Me/Si ratio of nanolaminate 906B is about 1:2.

Figure 9D:
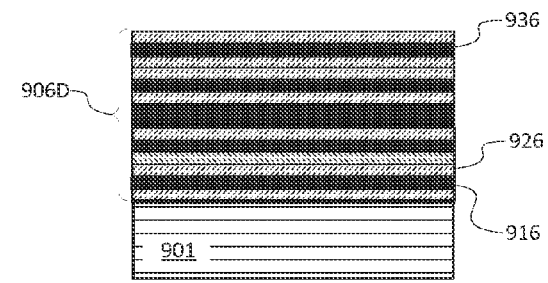

FIGS. 9C and 9D illustrate examples of gradient nanolaminates. Nanolaminate 906C is silicon-rich at the bottom and metal-rich at the top. Nanolaminate 906D is silicon-rich at the edges and metal-rich in the center. The illustrated gradients are depth-wise, i.e., in a direction perpendicular to the surface of substrate 901 on which the nanolaminates are formed. Other variations of nanolaminate layer distribution are also within the scope. Any of them may be used with the MeOx and SiOx layers of the FIG. 8 method or other methods within the scope.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A device, comprising:
   a first layer operable as a first electrode;
   a second layer;
   a third layer operable as a variable resistance layer switchable between a high resistance state and a low resistance state;
   a fourth layer operable as a second electrode;
   a fifth layer operable as a defect reservoir,
   wherein the fifth layer comprises mobile defects;
   wherein the second layer and the third layer are between the first layer and the fourth layer;
   wherein the first layer comprises a nitride of a metal; and
   wherein the second layer comprises a compound oxide of the metal and silicon.

2. The device of claim 1, wherein the metal comprises at least one of hafnium, lanthanum, molybdenum, tantalum, titanium, tungsten, or zirconium.

3. The device of claim 1, wherein the fourth layer comprises titanium nitride.

4. The device of claim 1, wherein the third layer comprises a low-ionicity material.

5. The device of claim 1, wherein the third layer comprises at least one of silicon oxide, silicon oxynitride, silicon nitride, aluminum oxide, aluminum oxynitride, hafnium oxynitride, hafnium aluminum oxide, hafnium silicon oxide, or hafnium silicon oxynitride.

6. The device of claim 1, wherein the fifth layer comprises a high-ionicity material.

7. The device of claim 1, wherein the fifth layer comprises at least one of an oxide, nitride, or oxynitride of hafnium, tantalum, titanium, or zirconium.

8. The device of claim 1, wherein the fifth layer comprises a compound oxide of the metal and silicon; and
   wherein the fifth layer contains less oxygen than the third layer.

9. The device of claim 1, wherein the first layer further comprises silicon.

10. The device of claim 1, wherein the third layer and the second layer have identical compositions.

11. The device of claim 1, wherein the second layer has a first depth-wise gradient from a metal-rich compound oxide of the metal and silicon to a balanced compound oxide of the metal and silicon; and
    wherein the third layer has a second gradient from a silicon-rich compound oxide of the metal and silicon to silicon oxide.

* * * * *